(12) United States Patent
Mahoney et al.

(10) Patent No.: US 11,882,667 B1
(45) Date of Patent: Jan. 23, 2024

(54) LID ASSEMBLY INCLUDING GASKET FOR OUTDOOR ELECTRONIC DEVICE HOUSING AND HYBRID FIBER-COAXIAL (HFC) NETWORK COMPONENT INCLUDING SAME

(71) Applicant: Applied Optoelectronics, Inc., Sugar Land, TX (US)

(72) Inventors: William G. Mahoney, Suwanee, GA (US); Brendan Stringer, Woodstock, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 1 day.

(21) Appl. No.: 17/888,913

(22) Filed: Aug. 16, 2022

(51) Int. Cl.
| | |
|---|---|
| *H05K 5/03* | (2006.01) |
| *H05K 5/00* | (2006.01) |
| *H05K 7/20* | (2006.01) |
| *H05K 5/06* | (2006.01) |

(52) U.S. Cl.
CPC ............ *H05K 5/03* (2013.01); *H05K 5/0043* (2013.01); *H05K 5/0052* (2013.01); *H05K 5/061* (2013.01); *H05K 7/20409* (2013.01)

(58) Field of Classification Search
CPC ...................................................... H05K 7/00
See application file for complete search history.

(56) References Cited

U.S. PATENT DOCUMENTS 9,696,506 B2 * 7/2017 Wu ..................... H05K 7/20409
10,136,557 B2 * 11/2018 Kim ................... H05K 7/20336

* cited by examiner

*Primary Examiner* — Jerry Wu
(74) *Attorney, Agent, or Firm* — Grossman Tucker Perreault & Pfleger, PLLC; Norman S. Kinsella (57) ABSTRACT

A lid assembly containing a lid gasket may be used to replace an existing lid assembly that forms part of a housing of an outdoor electronic device, such as an RF amplifier in a hybrid fiber-coaxial (HFC) network delivering CATV services to subscriber locations. The replacement lid assembly is configured to engage and cover an existing base of the electronic device, such as an RF amplifier, without disconnecting the electronic device (e.g., without interrupting CATV service). The lid gasket in the lid assembly may comply with current requirements and/or standards and is configured to engage the existing base adjacent an older gasket in the base to reinforce sealing of the electronic device housing. The lid assembly may also be configured to include improved or upgraded electronic components, such as an integrated power supply, and/or to provide improved heat transfer.

12 Claims, 7 Drawing Sheets

LID ASSEMBLY INCLUDING GASKET FOR OUTDOOR ELECTRONIC DEVICE HOUSING AND HYBRID FIBER-COAXIAL (HFC) NETWORK COMPONENT INCLUDING SAME

TECHNICAL FIELD

The present disclosure relates to housings for outdoor electronic devices and more particularly, to a lid assembly including a gasket for an outdoor electronic device, such as a hybrid fiber-coaxial (HFC) network component.

BACKGROUND INFORMATION

Electronic devices are often used in outdoor environments, such as in a hybrid fiber-coaxial (HFC) network delivering CATV services to subscriber locations. In such devices, the housing should be capable of withstanding environmental conditions outside of the housing as well as accommodating the electronic components inside the housing with appropriate thermal management and EMI shielding. These housings often include gaskets that provide sealing against the outside environment and weather and provide EMI shielding for the electronic components contained inside.

Certain electronic devices, such as RF amplifiers in a CATV/HFC network, may need to be upgraded, for example, to accommodate higher bandwidth and frequencies, to implement improved technology, and/or to ensure adequate sealing and/or EMI shielding. In particular, the gaskets may deteriorate over time and fail to provide adequate sealing against weather and EMI shielding. Upgrading such devices in a CATV/HFC network without interrupting the CATV services provided to the subscriber locations presents unique challenges.

SUMMARY

According to one aspect of the present disclosure, a replacement lid assembly is provided for an RF amplifier housing in a hybrid fiber-coaxial (HFC) network. The replacement lid assembly includes a lid body portion defining at least a first lid chamber for housing electronic components in the RF amplifier housing. A lid rim extends around the lid body portion and is configured to engage a base rim on a base of the RF amplifier housing. The lid rim defines a lid gasket channel, and the replacement lid assembly also includes a lid gasket seated in the lid gasket channel. The lid gasket is configured to engage a surface on the base rim of the base of the RF amplifier housing adjacent a base gasket.

According to another aspect of the present disclosure, a housing is provided for an electronic device used in an outdoor environment. The housing includes a base and a lid assembly pivotably coupled to the base. The base includes a base body portion defining a base chamber for housing electronic components of the electronic device, a base rim extending around the base body portion and defining a base gasket channel, and a base gasket located in the base gasket channel of the base body portion. The lid assembly includes a lid body portion defining at least a first lid chamber for housing at least a portion of electronic components of the electronic device, a lid rim extending around the lid body portion and defining a lid gasket channel, and a lid gasket seated in the lid gasket channel. The lid gasket engages a surface on the base rim of the base body portion inside of the base gasket.

According to a further aspect of the present disclosure, an RF amplifier is provided for use in a hybrid fiber-coaxial (HFC) network. The RF amplifier includes an amplifier housing comprising a base and a lid assembly coupled to the base. The base includes a base body portion defining a base chamber for housing electronic components of the electronic device, a base rim extending around the base body portion and defining a base gasket channel, and a base gasket located in the base gasket channel of the base body portion. The lid assembly includes a lid body portion coupled to the base body portion, the lid body portion defining at least a first lid chamber for housing at least a portion of electronic components of the electronic device, a lid rim extending around the lid body portion and defining a lid gasket channel, and a lid gasket seated in the lid gasket channel. The lid gasket engages a surface on the base rim of the base body portion outside of the base gasket. The RF amplifier also includes amplifier circuitry mounted to the base and disposed partially in the base chamber of the amplifier housing. The amplifier circuitry is partially received in the first lid chamber of the lid assembly such that the lid assembly can be removed without disconnecting the amplifier circuitry.

BRIEF DESCRIPTION OF THE DRAWINGS

These and other features and advantages will be better understood by reading the following detailed description, taken together with the drawings wherein.

DETAILED DESCRIPTION

A lid assembly containing a lid gasket, consistent with embodiments of the present disclosure, may be used to replace an existing lid assembly that forms part of a housing of an outdoor electronic device, such as an RF amplifier in a hybrid fiber-coaxial (HFC) network delivering CATV services to subscriber locations. The replacement lid assembly is configured to fit and cover an existing base of the electronic device, such as an RF amplifier, without disconnecting the electronic device (e.g., without interrupting CATV service). The lid gasket in the lid assembly may comply with current requirements and/or standards and is configured to engage the existing base adjacent an older gasket in the base to reinforce sealing of the electronic device housing. The lid assembly may also be configured to include improved or upgraded electronic components, such as an integrated power supply, and/or to provide improved heat transfer. The lid assembly, consistent with embodiments disclosed herein, may also be provided as part of a new electronic device with a new base.

As used herein, "outdoor electronic device" refers to an electronic device configured for outdoor usage and complying with standards and/or requirements for outdoor usage, such as an ingress protection (IP) rating of IP68 defined under IEC 60529 and a shielding effectiveness as measured according to ANSI/SCTE 48-1 2015. The term "coupled" as used herein refers to any connection, coupling, link or the like between elements. Such "coupled" elements are not necessarily directly connected to one another and may be separated by intermediate components. The term "thermally coupled" refers to a direct or indirect connection between elements that allows heat to transfer from one element to the other element.

Referring to FIGS. 1-4, an outdoor electronic device 100 including a lid assembly 110, consistent with embodiments of the present disclosure, is shown and described in greater detail. The lid assembly 110 together with a base 120 forms a housing for the electronic device 100, and the lid assembly 110 is configured to replace older lid assemblies without removing the base 120 of the existing electronic device 100 in the field. The lid assembly 110 includes a lid body portion 111 that defines one or more chambers, a lid rim 112 extending around the lid body portion 111, and a lid gasket 114 disposed in the lid rim 112. The base 120 includes a base body portion 121 that defines one or more chambers, a base rim 122 extending around the base body portion 121 and a base gasket 124 disposed in the base rim 122.

Figure 1:
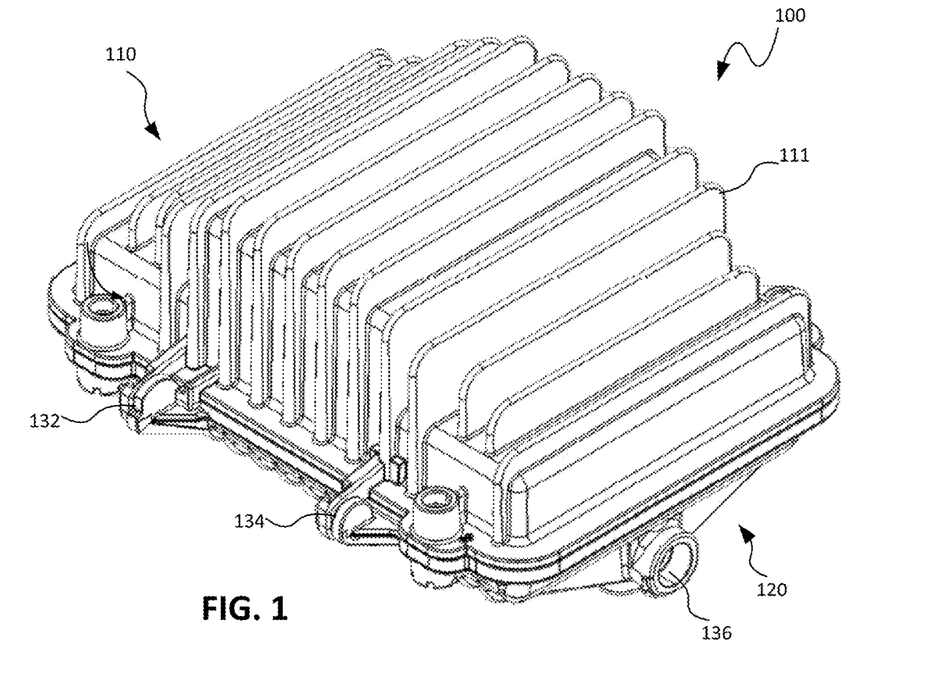
FIG. 1 is a perspective view of an electronic device including a lid assembly containing a lid gasket, consistent with embodiments of the present disclosure, with the lid assembly in a closed position.
Figure 2:
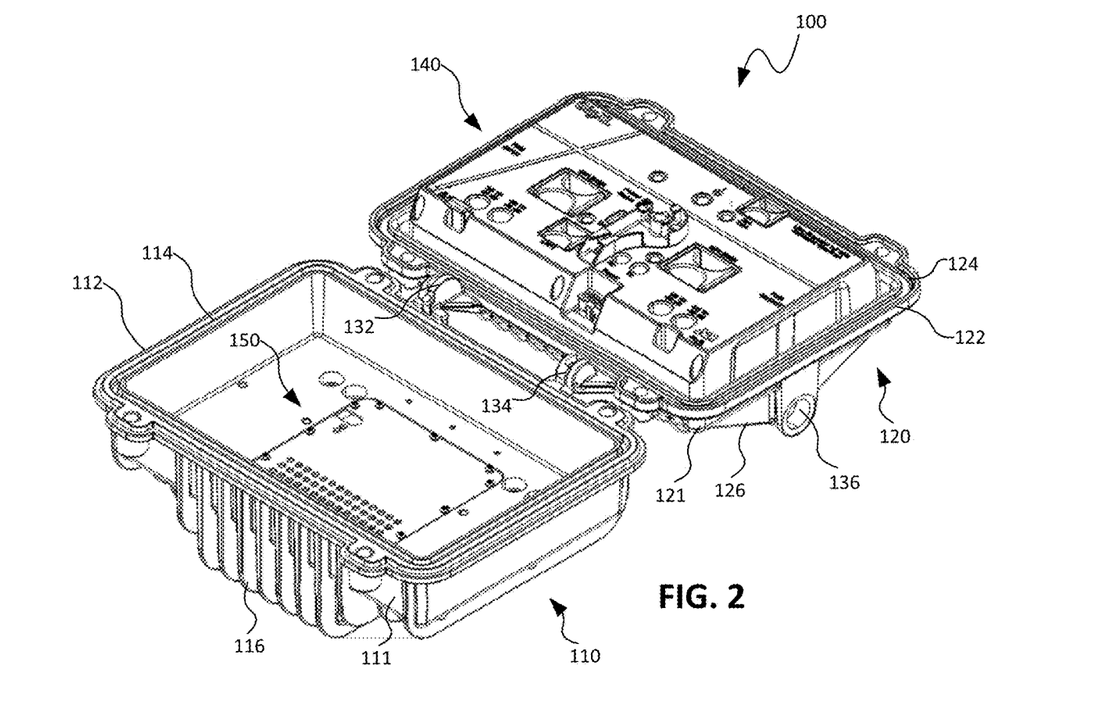
FIG. 2 is a perspective view of the electronic device in FIG. 1 with the lid assembly in an open position.
Figure 3:
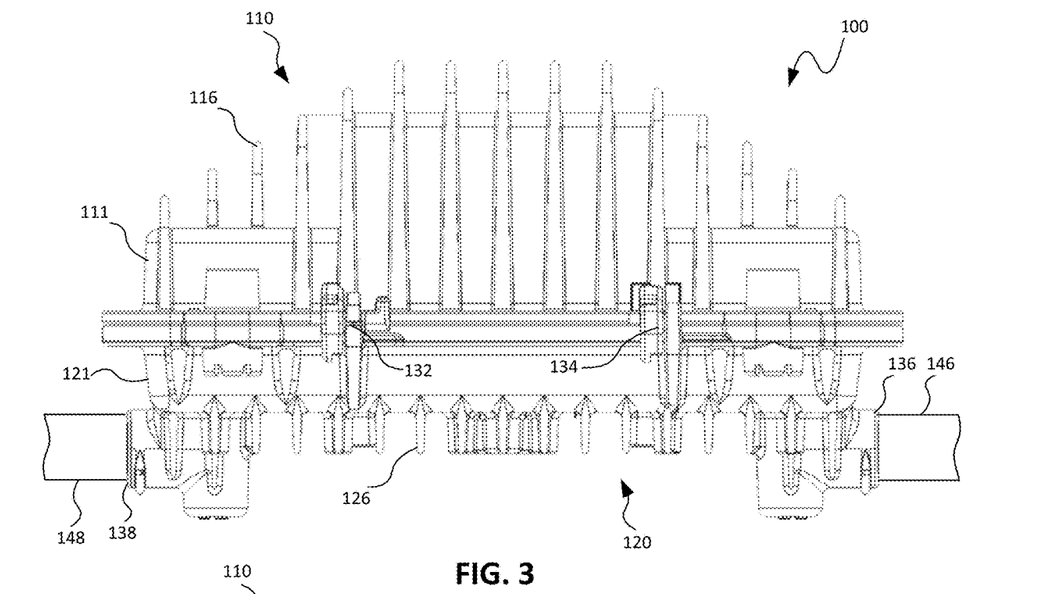
FIG. 3 is a side view of the electronic device in FIG. 1.
Figure 4:
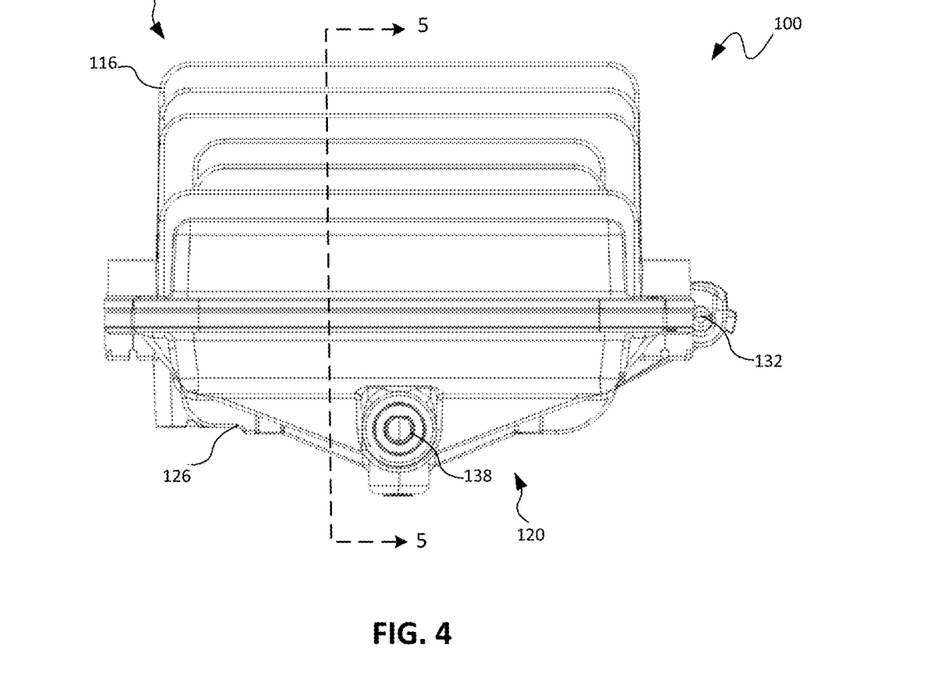
FIG. 4 is an end view of the electronic device in FIG. 1.

In the illustrated embodiment, the lid assembly 110 and the base 120 are coupled with hinges 132, 132, forming a clamshell configuration (FIG. 2), and both the lid assembly 110 and the base 120 include heat transfer fins 116, 126 extending from an outside of the respective body portions 111, 121. The lid gasket 114 in the lid rim 112 engages the base rim 122 adjacent the base gasket 124, thereby sealing the housing when closed (FIGS. 1, 3, and 4). Thus, replacing an older lid with the lid assembly 110 may allow improved sealing with an upgraded gasket 114 when the existing base gaskets 124 are less effective. Such a replacement and upgrade may be made advantageously without having to replace or disconnect the base 120.

In some embodiments, the outdoor electronic device 100 may be an RF amplifier in an HFC network delivering CATV services to subscriber locations. In such embodiments, the base 120 contains amplifier circuitry 140 at least partially disposed in the chamber defined by the base body portion 121. The illustrated embodiment of the base 120 also includes at least first and second connector ports 136, 138 extending from the base body portion 121 and configured to connect to cables 146, 148, such as coaxial cables, carrying RF signals. Providing the lid assembly 110 to replace an existing lid assembly in an RF amplifier allows the base 120 of the RF amplifier to remain connected and avoids disruption of CATV services.

The lid assembly 110 may also include other improvements for upgrading an RF amplifier without disconnecting the base 120 of the RF amplifier and interrupting services. In an embodiment, for example, the lid assembly 110 includes an integrated power supply 150 located in a chamber defined by the lid body portion 111, which allows upgraded power supplies supporting increased frequencies (e.g., up to 1.8 GHz) without having to use separate power supply modules. The lid assembly 110 may also have improved heat transfer properties, for example, by increasing the surface area for cooling by about 25%.

Figure 5:
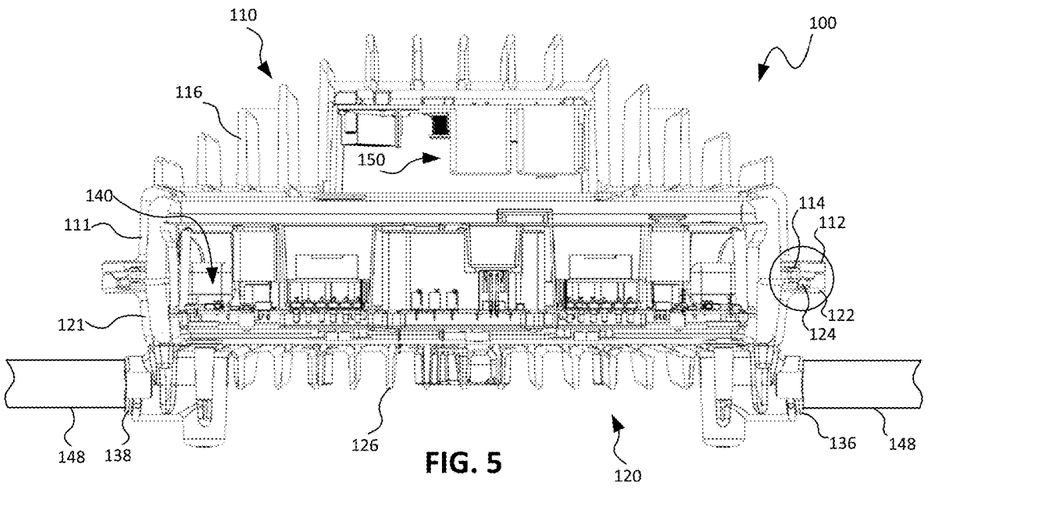
FIG. 5 is a cross-sectional view of the electronic device in FIG. 1 taken along line 5-5.
Figure 6:
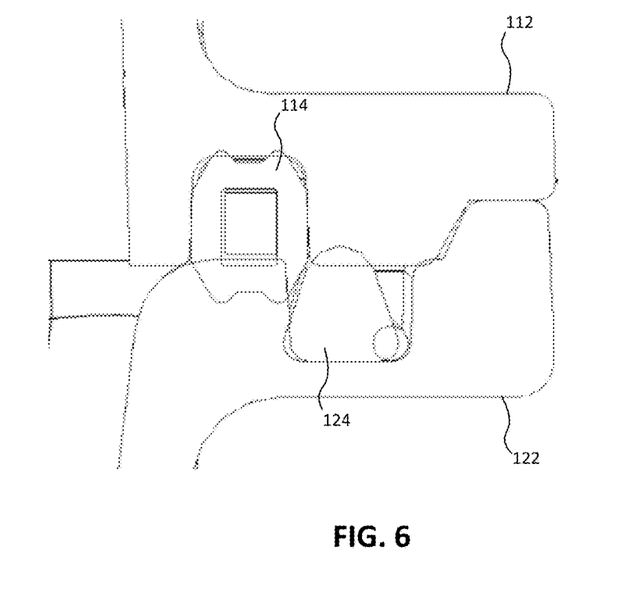
FIG. 6 is an enlarged cross-sectional view of the lid assembly engaging the base of the electronic device in FIG. 5.

FIGS. 5 and 6 show a cross section of the electronic device 100 including the gaskets 114, 124 between the lid assembly 110 and the base 120 for sealing the electronic device. As shown in FIG. 5, the amplifier circuitry 140 is mounted in the base 120 and partially disposed in a chamber defined by the base body portion 121, but a portion of the amplifier circuitry 140 may be received in a chamber defined by the lid body portion 111. The lid assembly 110 may be removed without removing the amplifier circuitry 140 from the base 120 and without disconnecting cables 146, 148 from the connector ports 136, 138 on the base 120. As shown in FIG. 6, the lid gasket 114 engages the base rim 122 adjacent the base gasket 124, for example, on an inside of the base gasket 124. As such, the lid gasket 114 provides the primary sealing and EMI shielding, which allows the sealing and EMI shielding to be upgraded, for example, if an existing base gasket 124 is deteriorated and/or if the gasket must comply with new requirements.

Figure 7:
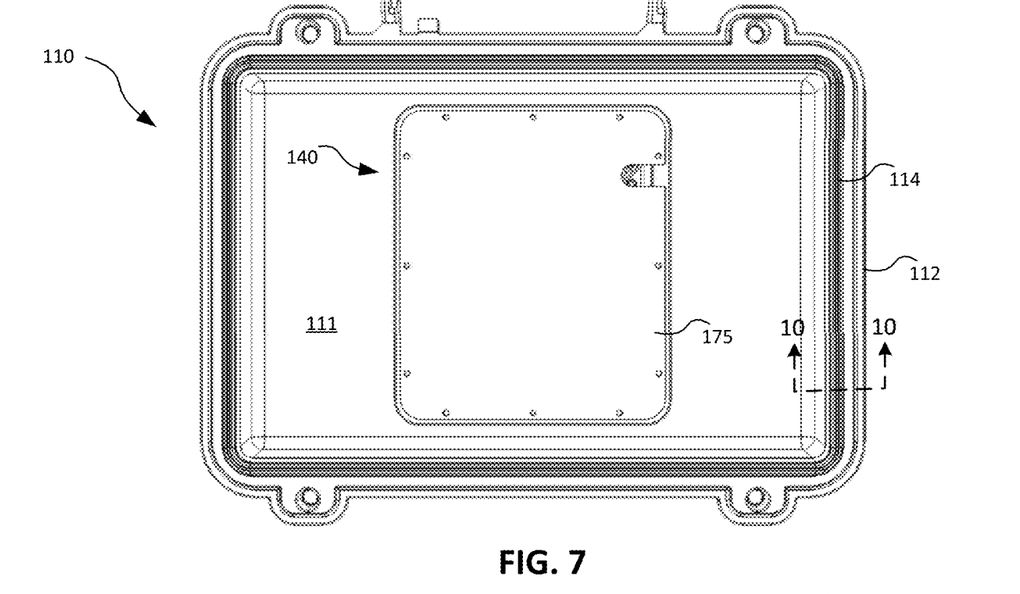
FIG. 7 is a plan view of an embodiment of a lid assembly containing a lid gasket and including a cover over a recessed lid chamber.

Referring to FIGS. 7-11, an embodiment of the lid assembly 110 is shown and described in greater detail. In this embodiment, the lid body portion 111 defines at least a first lid chamber 172 and at least a second lid chamber 174 recessed from the first lid chamber 172. The integrated power supply 150, and/or other electronic components, are disposed in the recessed second lid chamber 174, and the amplifier circuitry 140 is received in the first lid chamber 172 when the lid assembly 110 covers the base 120 (as shown in FIG. 5). A cover 175 may be provided over the second lid chamber 174 covering the components disposed therein (FIG. 7).

Figure 8:
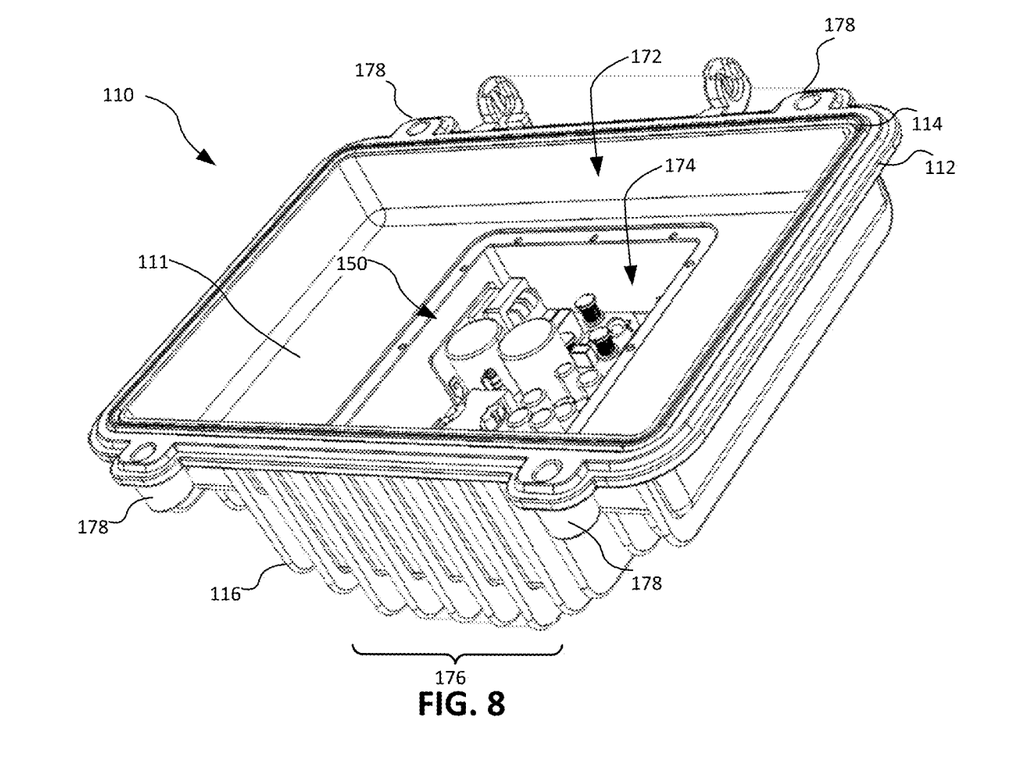
FIG. 8 is a perspective view of the lid assembly shown in FIG. 7 with the recessed lid chamber open.
Figure 9:
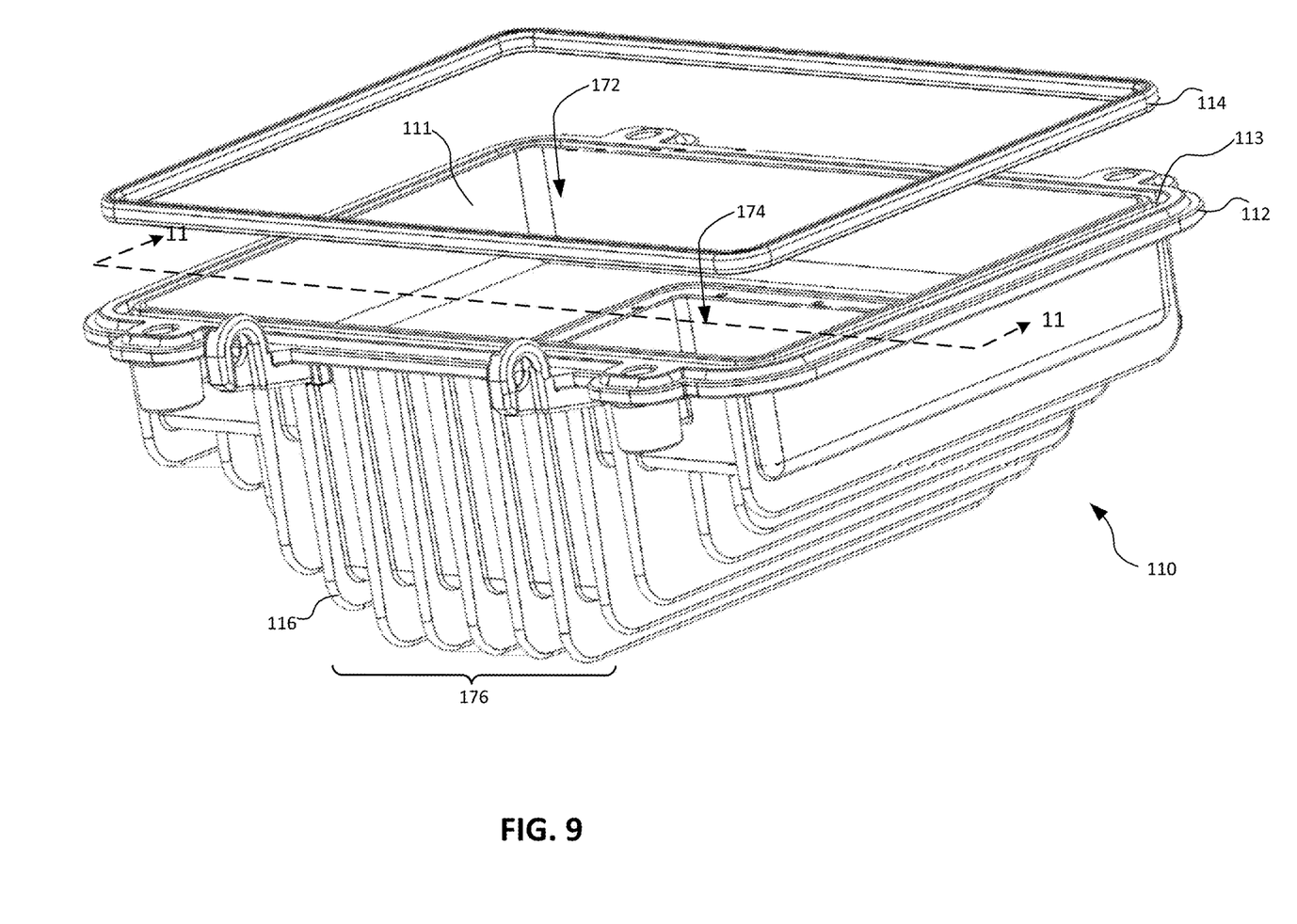
FIG. 9 is an exploded perspective view of an embodiment of a lid assembly and gasket.

The second lid chamber 174 is formed by an extended or protruding section 176 of the lid body portion 111, which also increases the surface area for cooling. The heat transfer fins 116 are located on the outside of the lid body portion 111 including the protruding section 176 and adjacent the protruding section 176. The height of the heat transfer fins 116 tapers from the protruding section to the ends of the lid body portion 111 to facilitate air flow around the fins. In an embodiment, the lid assembly 110 with the heat transfer fins 116 may provide a surface area for cooling with an increase in the amount of cooling fin surface area of about 15-20% within the same volume as a legacy lid being replaced.

Figure 10:
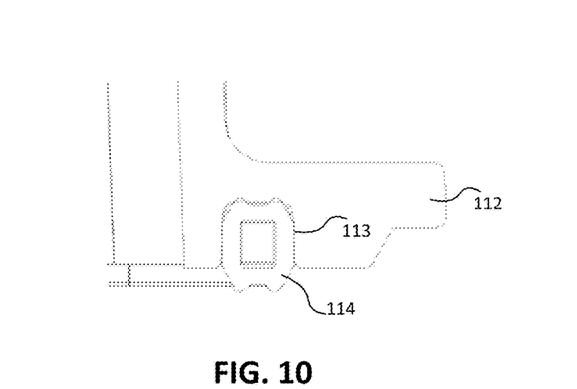
FIG. 10 is a cross-sectional view of the gasket seated in the rim of the lid assembly taken along line 10-10 in FIG. 7.
Figure 11:
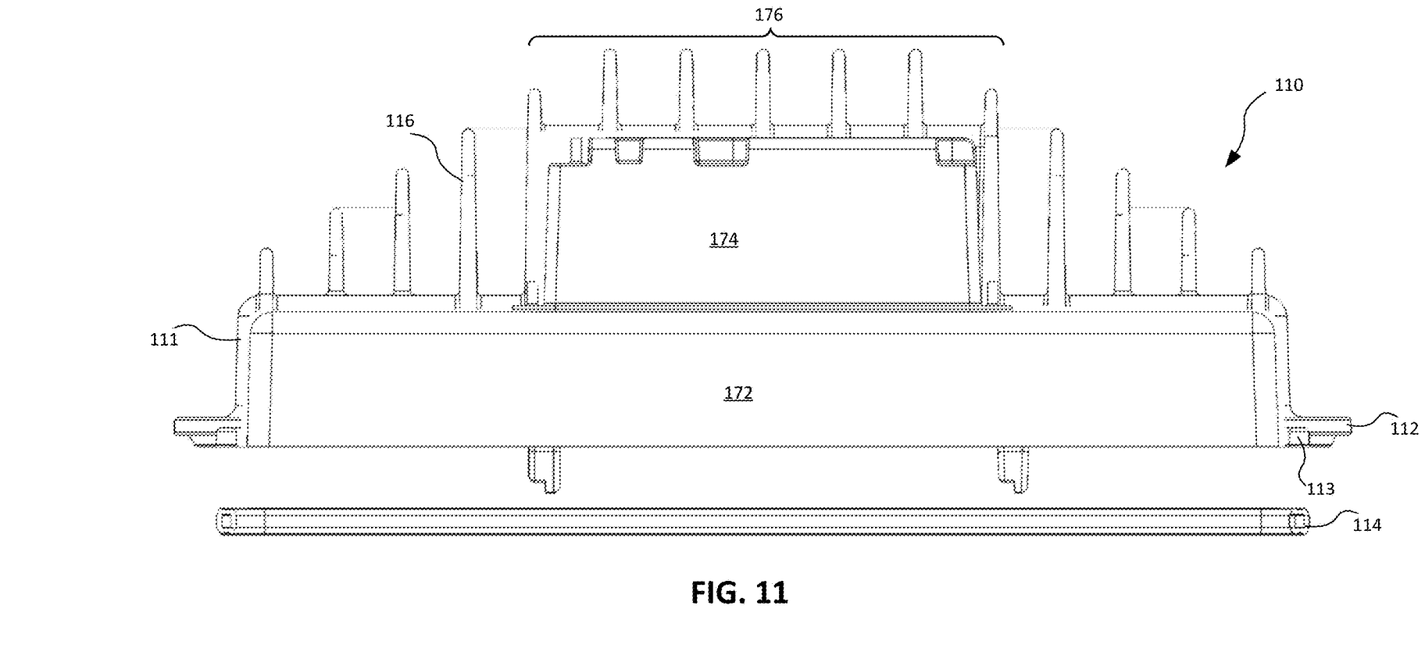
FIG. 11 is an exploded, cross-sectional view of the lid assembly and gasket taken along line 11-11 in FIG. 9.

The lid rim 112 extends around the lid body portion 111 and defines a lid gasket channel 113 that receives the lid gasket 114. The lid gasket 114 may be configured and sized to fit tightly in the lid gasket channel 113 with a portion extending outside the lid gasket channel 113, as shown in FIG. 10, to engage and seal against a base rim. The lid assembly 110 may also include fastening structures 178 spaced around the lid rim 112 to received fasteners to secure the lid assembly 110 to a base.

Figures 12A, 12C:
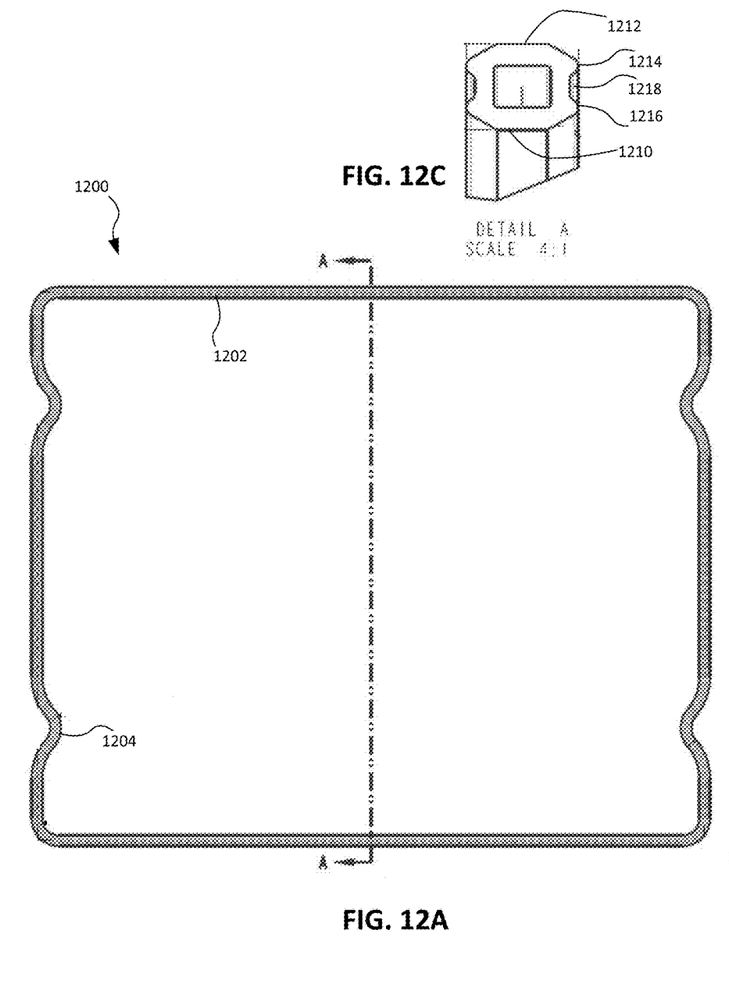
FIG. 12A is a plan view of a gasket for use in the lid assembly, consistent with embodiments of the present disclosure.
FIG. 12C is an enlarged cross-sectional view of the gasket in FIGS. 12A and 12B
Figure 12B:
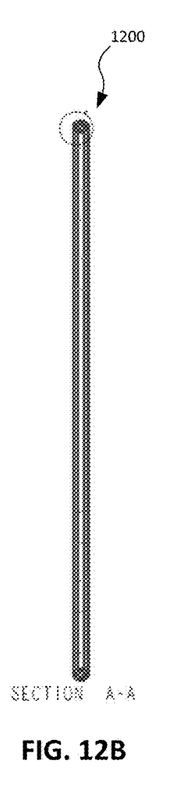
FIG. 12B is a cross-sectional view of the gasket taken along line A-A in FIG. 12A.

Referring to FIGS. 12A-12C, an embodiment of the lid gasket 1200 is shown and described in greater detail. In this embodiment, the lid gasket 1200 has a generally rectangular shape that matches the shape of the lid gasket channel 113 in the lid rim 112 of the lid assembly 110. This embodiment of the lid gasket 1200 also includes straight sections 1202 and one or more curvatures 1204 that biases the conductive portion 1210 of the lid gasket 1200 to the inside. The lid gasket 1200 may be designed to provide an ingress protection (IP) rating of IP68 defined under IEC 60529 and a shielding effectiveness as measured according to ANSI/SCTE 48-1 2015. Although one embodiment of a lid gasket is shown and described, a lid assembly, consistent with embodiments of the present disclosure, may include other types of gaskets with different configurations and/or materials.

The lid gasket 1200 may include a conductive portion 1210 on the inside and a non-conductive portion 1212 on the outside. The conductive portion 1210 may have a resistance of 10-15 ohms. The lid gasket 1200 may be co-extruded, for example, from a conductive elastomer and a non-conductive elastomer. The conductive elastomer may include, for example, a nickel/graphite filled silicone elastomer such as the ECE072 silicone elastomer available from Laird Performance Materials. This silicone elastomer has good shielding properties, provides sealing at high temperatures, is ozone resistant, and has a long shelf life. Other materials are also contemplated.

In the illustrated embodiment, the lid gasket 1200 includes a hollow profile with ridges 1214, 1216 on each side of a valley 1218, which facilitates deformation of the gasket 1200 and forming a seal against a surface of the base rim 122 on the base 120. As mentioned above, the lid gasket 1200 may be co-extruded with the outer portion providing the weather sealing and the inner portion providing the shielding.

Accordingly, a lid assembly with a lid gasket, consistent with embodiments of the present disclosure, may replace existing lid assemblies to upgrade existing outdoor electronic devices, such as RF amplifiers in an HFC network, without interrupting service. The outdoor electronic device may be upgraded by replacing the lid assembly, for example, by providing a lid gasket with higher performance, by providing an integrated power supply in the lid, and/or by providing increased surface area for heat transfer and cooling.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A replacement lid assembly for an RF amplifier housing in a hybrid fiber-coaxial (HFC) network, the replacement lid assembly comprising: a lid body portion defining at least a first lid chamber with an opening for housing electronic components in the RF amplifier housing; a lid rim surrounding the opening around the lid body portion and configured to engage a base rim on a base of the RF amplifier housing, wherein the lid rim defines a lid gasket channel; and a lid gasket seated in the lid gasket channel, wherein the lid gasket is configured to engage a surface on the base rim of the base of the RF amplifier housing adjacent a base gasket; and the lid body portion includes an extended section defining a second lid chamber extending from a bottom of the lid body portion opposite to the opening, and further comprising an integrated power supply disposed in the second lid chamber; and wherein heat transfer fins are extended away from the opening on the extended section and the bottom of the lid body portion.

2. The replacement lid assembly of claim 1, further comprising heat transfer fins extending from an outer side of the lid body portion, wherein the integrated power supply is thermally coupled to the lid body portion such that heat is transferred from the integrated power supply to the heat transfer fins.

3. The replacement lid assembly of claim 1, wherein the lid gasket is made of silicone.

4. The replacement lid assembly of claim 1, wherein the lid gasket includes a conductive portion on an inside and a non-conductive portion on an outside.

5. The replacement lid assembly of claim 1, wherein the lid gasket includes at least one curvature section configured to bias the lid gasket inside the lid gasket channel.

6. The replacement lid assembly of claim 1, wherein the lid gasket includes a conductive elastomer on an inside portion and a non-conductive elastomer on an outside portion.

7. A housing for an electronic device used in an outdoor environment, the housing comprising: a base comprising: a base body portion defining a base chamber for housing electronic components of the electronic device; a base rim extending around the base body portion and defining a base gasket channel; and a base gasket located in the base gasket channel of the base body portion; and a lid assembly pivotably coupled to the base, the lid assembly comprising: a lid body portion defining at least a first lid chamber with an opening for housing at least a portion of electronic components of the electronic device; a lid rim surrounding the opening and extending around the lid body portion and defining a lid gasket channel; and a lid gasket seated in the lid gasket channel, wherein the lid gasket engages a surface on the base rim of the base body portion inside of the base gasket; and the lid body portion includes an extended section defining a second lid chamber extending from a bottom of the lid body portion opposite to the opening, and further comprising an integrated power supply disposed in the second lid chamber; and wherein heat transfer fins are extended away from the opening on the extended section and the bottom of the lid body portion.

8. The housing of claim 7, wherein the lid gasket includes a conductive portion on an inside and a non-conductive portion on an outside.

9. An RF amplifier for use in a hybrid fiber-coaxial (HFC) network, the RF amplifier comprising: an amplifier housing comprising a base and a lid assembly coupled to the base; wherein the base comprises: a base body portion defining a base chamber for housing electronic components of the electronic device; a base rim extending around the base body portion and defining a base gasket channel; and a base gasket located in the base gasket channel of the base body portion; wherein the lid assembly comprises: a lid body portion coupled to the base body portion, the lid body portion defining at least a first lid chamber with an opening for housing at least a portion of electronic components of the electronic device; a lid rim surrounding the opening and extending around the lid body portion and defining a lid gasket channel; and a lid gasket seated in the lid gasket channel, wherein the lid gasket engages a surface on the base rim of the base body portion outside of the base gasket; and amplifier circuitry mounted to the base and disposed partially in the base chamber of the amplifier housing, wherein the amplifier circuitry is partially received in the first lid chamber of the lid assembly such that the lid assembly can be removed without disconnecting the amplifier circuitry; and the lid body portion includes an extended section defining a second lid chamber extending from a bottom of the lid body portion opposite to the opening, and further comprising an integrated power supply disposed in the second lid chamber; and wherein heat transfer fins are extended away from the opening on the extended section and the bottom of the lid body portion.

10. The RF amplifier of claim 9, wherein the amplifier circuitry is configured to amplify RF signals up to 1.8 GHz.

11. The RF amplifier of claim 9, further comprising at least first and second connector ports extending from the base body portion for connecting to cables carrying RF signals.

12. The RF amplifier of claim 9, wherein the lid gasket includes a conductive portion on an inside and a non-conductive portion on an outside.

* * * * *